United States Patent
Yu et al.

(10) Patent No.: US 8,648,352 B2
(45) Date of Patent: Feb. 11, 2014

(54) SEMICONDUCTOR LIGHT EMITTING STRUCTURE

(75) Inventors: Chang-Chin Yu, Zhubei (TW); Mong-Ea Lin, Taipei (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 13/314,340

(22) Filed: Dec. 8, 2011

(65) Prior Publication Data

US 2012/0299013 A1    Nov. 29, 2012

(30) Foreign Application Priority Data

May 23, 2011    (TW) .............................. 100117993 A

(51) Int. Cl.
*H01L 29/15*    (2006.01)

(52) U.S. Cl.
USPC ................... 257/77; 257/79; 257/86; 257/88; 257/95; 257/98

(58) Field of Classification Search
None
See application file for complete search history.

(56) References Cited

U.S. PATENT DOCUMENTS

| | | | |
|---|---|---|---|
| 7,635,875 B2 | 12/2009 | Niki et al. | |
| 7,638,414 B2 | 12/2009 | Choi et al. | |
| 2001/0010941 A1* | 8/2001 | Morita | 438/46 |
| 2008/0169482 A1* | 7/2008 | Kang | 257/98 |

* cited by examiner

*Primary Examiner* — Kyoung Lee
(74) *Attorney, Agent, or Firm* — McClure, Qualey & Rodack, LLP

(57) ABSTRACT

A semiconductor light emitting structure including a substrate, a patterned structure, a first semiconductor layer, an active layer and a second semiconductor layer is provided. The patterned structure is protruded from or indented into a surface of the substrate, so that the surface of the substrate becomes a roughed surface. The patterned structure has an asymmetrical geometric shape. The first semiconductor layer is disposed on the roughed surface. The active layer is disposed on the first semiconductor layer. The second semiconductor is disposed on the active layer.

18 Claims, 3 Drawing Sheets

SEMICONDUCTOR LIGHT EMITTING STRUCTURE

This application claims the benefit of Taiwan application Serial No. 100117993, filed May 23, 2011, the subject matter of which is incorporated herein by reference.

BACKGROUND OF THE INVENTION

1. Field of the Invention

The invention relates in general to a light emitting element, and more particularly to a semiconductor light emitting structure with a patterned structure.

2. Description of the Related Art

Light emitting diode (LED) emits the light through photoelectron conversion. The main constituting material of the light emitting diode is semiconductor, wherein the semiconductor with a higher ratio of holes carrying positive charges is referred as a P-type semiconductor, and the semiconductor with a higher ratio of electrons carrying negative charges is referred as an N-type semiconductor. A PN joint is formed at the junction between the P-type semiconductor and the N-type semiconductor. When voltages are applied to the positive electrode and the negative electrode of an LED, electrons and holes are combined and emitted in the form of the light.

Due to the advantages of long lifespan, low temperature and high energy utilization rate, LED has been widely used in backlight modules, lamps, traffic lights, and brake lights, and has gradually replaced conventional light source.

However, the refractive index of the LED semiconductor substrate is far larger than the refractive index of the air, and the light emitted from the LED semiconductor and radiated toward the substrate may easily enter the substrate, but the light entering the substrate will be returned due to the total reflection at the substrate/air interface. As most of the light is confined in the substrate, the light cannot be emitted out, and the light extraction efficiency is not satisfactory.

SUMMARY OF THE INVENTION

The invention is directed to a semiconductor light emitting structure, which increases the reflection and scattering of the light with the patterned structure of the substrate so as to increase the light extraction efficiency.

According to an aspect of the present invention, a semiconductor light emitting structure is provided. The semiconductor light emitting structure includes a substrate, a patterned structure, a first semiconductor layer, an active layer and a second semiconductor layer. The patterned structure is protruded from or indented into a surface of the substrate, so that the surface of the substrate becomes a roughed surface. The patterned structure has an asymmetrical geometric shape. The first semiconductor layer is disposed on the roughed surface. The active layer is disposed on the first semiconductor layer. The second semiconductor is disposed on the active layer.

In an embodiment, examples of asymmetrical geometric shape include scalene triangle, scalene trapezoid, scalene and non-parallel polygon and a combination thereof.

In an embodiment, the asymmetrical geometric shape includes arc with variant curvature.

The above and other aspects of the invention will become better understood with regard to the following detailed description of the preferred but non-limiting embodiment(s). The following description is made with reference to the accompanying drawings.

DETAILED DESCRIPTION OF THE INVENTION

According to the semiconductor light emitting structure of the present embodiment, the patterned structure protruded from or indented into the substrate surface forms a protrusion portion and/or an indentation portion having specific geometric shape on the substrate surface. The protrusion portion refers to the portion protruded from the substrate surface, and the indentation portion refers to the portion indented into the substrate surface. Normally, the protrusion portion and the indentation portion are formed in company. For example, when a protrusion portion is formed on the substrate surface, the portion with a relatively lower position can be viewed as an indentation portion; when an indentation portion is formed on the substrate surface, the portion with a relatively higher position can be viewed as a protrusion portion. In the present embodiment, when a patterned structure forms a protrusion portion and/or an indentation portion on the substrate surface, the protrusion portion and/or the indentation portion formed thereon are viewed as meeting the expectation as long as such protrusion portion and/or indentation portion, which may be formed randomly or regularly, possess specific geometric shapes and up-and-down contour and achieve the same or similar function.

Various embodiments are disclosed below for detailed descriptions of the invention. However, these embodiments are for exemplification only, not for limiting the scope of protection of the invention. Furthermore, for simplification purpose, only the protruded-type patterned structure is illustrated in the following embodiments, but the scope of protection of the invention is not limited thereto, and the indented-type patterned structure is also within the scope of protection of the invention.

First Embodiment

Figure 1:
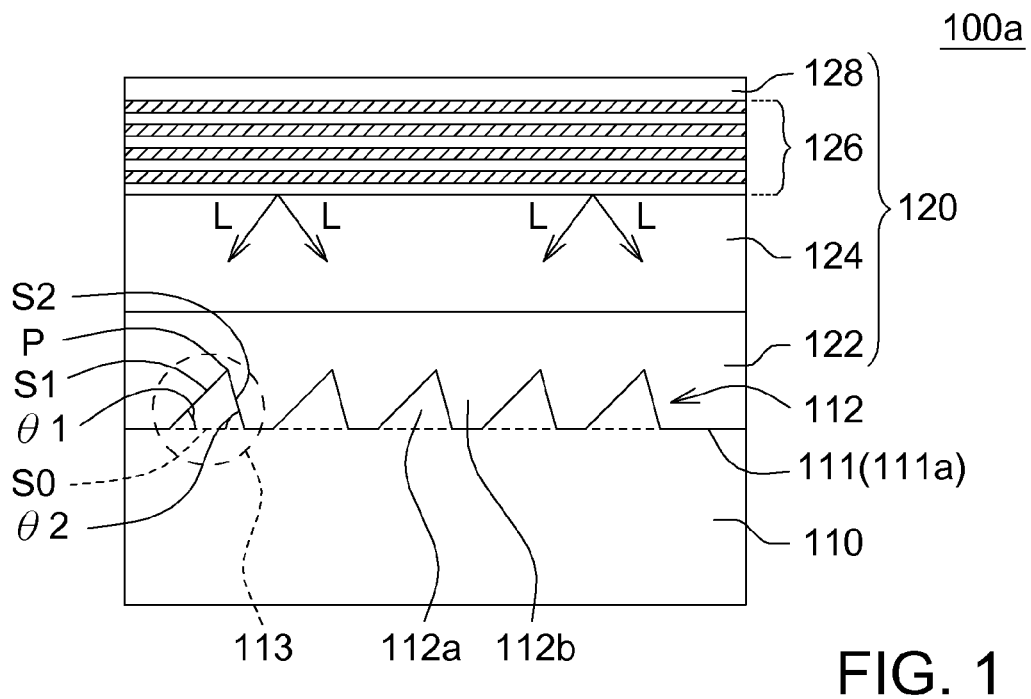
FIG. 1 shows a schematic diagram of a semiconductor light emitting structure according to an embodiment of the invention.

Referring to FIG. 1, a schematic diagram of a semiconductor light emitting structure according to an embodiment of the invention is shown. The semiconductor light emitting structure 100a includes a substrate 110, a patterned structure 112, a first semiconductor layer 124, an active layer 126 and a second semiconductor layer 128. The patterned structure 112 is protruded from or indented into a surface 111 of the substrate 110, so that the surface 111 of the substrate 110 becomes a roughed surface 111a. The patterned structure 112 has an asymmetrical geometric shape (circled with a dotted line 113). The first semiconductor layer 124 is disposed on the roughed surface 111a. The active layer 126 is disposed on the first semiconductor layer 124. The second semiconductor layer 128 is disposed on the active layer 126.

In the present embodiment of the invention, the patterned structure 112 is formed on the surface 111 of the substrate 110 through anisotropic etching process or reactive etching process, so that the surface 111 of the substrate 110 has a protrusion portion 112a (or an indentation portion 112b) with asymmetrical geometric shape. Ordinary anisotropic etching uses gas as the main etching medium, and drives reaction with plasma energy. The plasma decomposes etching gas molecules into highly reactive molecules capable of promptly etching the substrate 110. Besides, the plasma also makes the gas molecules ionized and carry charges. The substrate 110 is disposed on the cathode carrying negative charges. When the ions carrying positive charges are attracted by the cathode and moves in acceleration towards the cathode, the ions carrying positive charges will collide with the surface 111 of the substrate 110 at a particular angle to obtain a patterned structure 112 with particular geometric shape. The reactive etching process, which combines ion collision being a physical property and etching being a chemical reaction, possesses the advantages of anisotropic property and high etching selectivity, prevents a part of the surface from being collided by the ions so as to maintain its original shape, but makes another part of the surface being collided by the ions so as to react with the etching gas to form different shapes. Thus, the patterned structure 112 with asymmetric geometric shape is obtained.

In an embodiment, examples of asymmetrical geometric shape include scalene triangle, scalene trapezoid, scalene and non-parallel polygon and a combination thereof. Here below, the patterned structures 112 is exemplified in different geometric shapes one by one. However, such exemplification is not for limiting the invention. Referring to FIG. 1, a plurality of scalene triangles 113 distributed at regular intervals and have equal height are shown. Each scalene triangle 113 respectively has a first hypotenuse S1 and a second hypotenuse S2 opposite to each other. The first hypotenuse S1 and the second hypotenuse S2 intersect with each together at the vertex P, and respectively intersect with the bottom side S0. A first angle θ1 (an inner angle) is contained between the first hypotenuse S1 and a substrate surface (a bottom side S0), and a second angle θ2 (an inner angle) is contained between the second hypotenuse S2 and a substrate surface (a bottom side S0). Since the first angle θ1 is not equal to the second angle θ2, the length of the first hypotenuse S1 is not equal to that of the second hypotenuse S2, and the triangle formed thereby is a scalene triangle 113. In an embodiment, the first angle θ1 ranges between 30~90 degrees, and the second angle θ2 ranges between 30~90 degrees.

Figure 2:
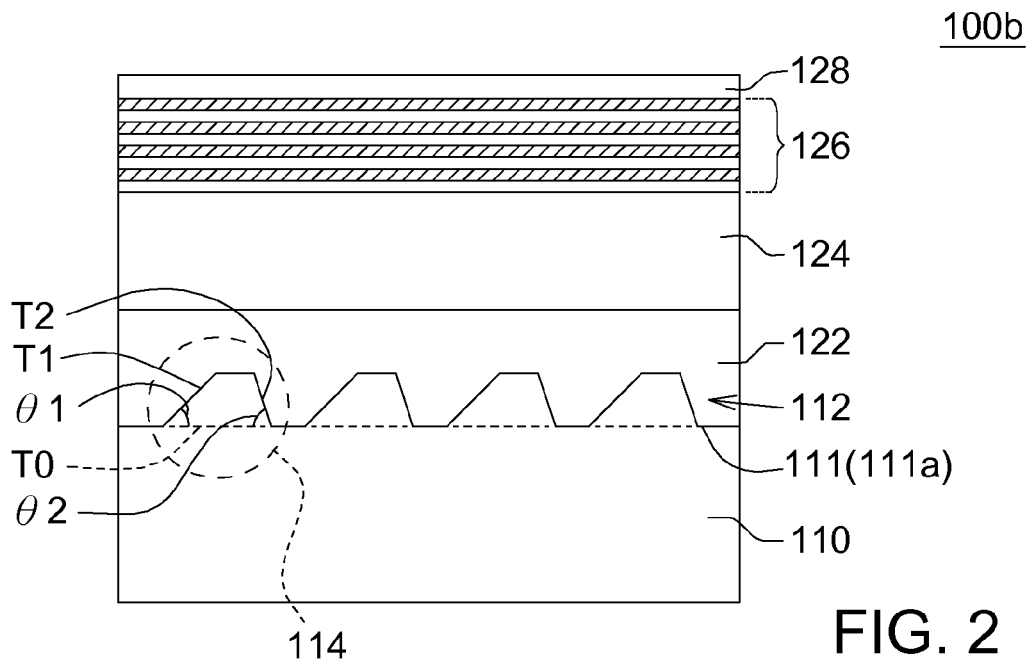
FIG. 2 shows a schematic diagram of a semiconductor light emitting structure according to an embodiment of the invention.

Referring to the semiconductor light emitting structure 100b of FIG. 2, a plurality of scalene trapezoids 114, which are distributed at a regular interval and have equal height, are shown. Each scalene trapezoid 114 has a first hypotenuse T1 and a second hypotenuse T2 opposite to each other. The first hypotenuse T1 and the second hypotenuse T2, which are non-parallel and have different lengths, respectively intersect with the bottom side T0. A first angle θ1 (the inner angle) is contained between the first hypotenuse T1 and the surface (the bottom side T0) of the substrate. A second angle θ2 (the inner angle) is contained between the second hypotenuse T2 and the surface (the bottom side T0) of the substrate. Since the first angle θ1 is not equal to the second angle θ2, the length of the first hypotenuse T1 is not equal to that of the second hypotenuse T2, and the trapezoid formed thereby is a scalene trapezoid 114. In an embodiment, the first angle θ1 ranges between 30~90 degrees, and the second angle θ2 ranges between 30~90 degrees.

Figure 3:
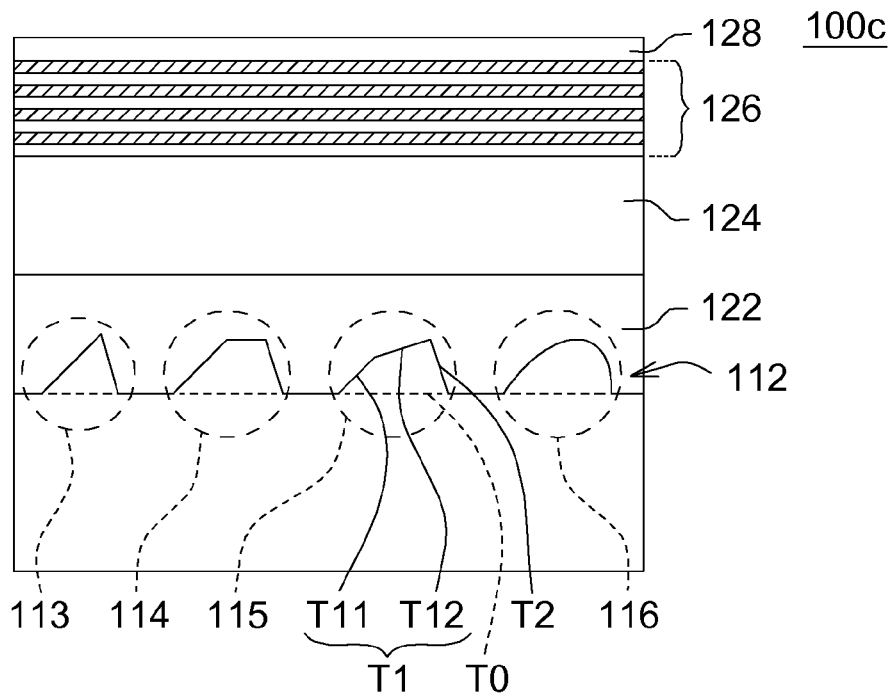
FIG. 3 shows a schematic diagram of a semiconductor light emitting structure according to an embodiment of the invention.

Referring to the semiconductor light emitting structure 100c of FIG. 3, a scalene triangle 113, a scalene trapezoid 114, a scalene and non-parallel polygon 115 and an arc 116 with variant curvature are arranged at random. In an embodiment, the scalene and non-parallel polygon 115, which can be realized by a quadrilateral or a pentagon, has a first hypotenuse T1 and a second hypotenuse T2 opposite to each other. The first hypotenuse T1 and the second hypotenuse T2, which are non-parallel and have different lengths, respectively intersect with the bottom side T0. The first hypotenuse T1 has more than one slope, and is composed of at least two hypotenuses T11 and T12 with different slopes. Since the first hypotenuse T1 has multiple slopes, the light scattering effect is enhanced. Besides, the arc 116 with variant curvature, such as an ellipsoid, a quasi-ellipsoid or an egg shape, is an arc formed by tangent track with continuous curvature changes, wherein the normal divides the line connecting two focal points into two segments with equal or unequal lengths. Therefore, the present embodiment of the invention can enhance the light scattering effect through the arc 116 with multiple curvature changes.

Referring to FIGS. 1, 2 and 3. When the patterned structure 112 with asymmetric geometric shape is formed on the surface 111 of the substrate 110, a non-doped semiconductor layer 122 can further be formed between the first semiconductor layer 124 and the patterned structure 112. Unlike the first semiconductor layer 124 and the second semiconductor layer 128 which are respectively doped with a pentavalent element (such as phosphorus, arsenic, antimony) and a trivalent element (such as aluminum, gallium, indium) to form a P-type semiconductor layer and an N-type semiconductor layer, the non-doped semiconductor layer 122 is not doped with any elements (such as silicon) and can be used as a buffer layer between the first semiconductor layer 124 and the substrate 110. When the metal-organic chemical vapor deposition (MOCVD) process is applied, an epitaxy layer 120 (such as gallium nitride) is formed on the substrate 110 at a high temperature environment, and thus can be used as an LED. In the present embodiment, the substrate 110 has many varieties such as sapphire substrate, silicon carbide substrate and silicon substrate. The epitaxy layer 120 is composed of a first semiconductor layer 124, an active layer 126 and a second semiconductor layer 128 arranged in a bottom up order. When voltages are applied on the first semiconductor layer 124 and the second semiconductor layer 128, the electrons and holes in the active layer 126 are combined together and emitted in the form of the light.

Furthermore, the crystal orientation, polarity and dislocation density of the epitaxy layer 120 affects the quality of the epitaxy layer 120. In the present embodiment, the patterned structure 112 with asymmetric geometric shape makes the dislocation in the epitaxy layer 120 extended in a horizontal direction and form a bending, lest threading dislocation might occur and extend upwards to the active layer 126 so as to affect the luminous efficiency of the active layer 126.

Besides, the patterned structure 112 of the roughed surface 111a reflects and scatters the light L radiated towards the substrate 110, so that the light L is scattered outwards and will not easily enter the substrate 110. Thus, the light extraction efficiency is increased.

Second Embodiment

FIG. 4A~4D respectively show 3D diagrams of a patterned structure 112 according to an embodiment of the invention. For the purpose of simplification, only the structure with one single patterned state is illustrated. However, the scope of protection of the invention is not limited thereto, and the structure with several patterned states arranged at random or with regularity is also within the scope of protection of the invention.

Figures 4A, 4B:
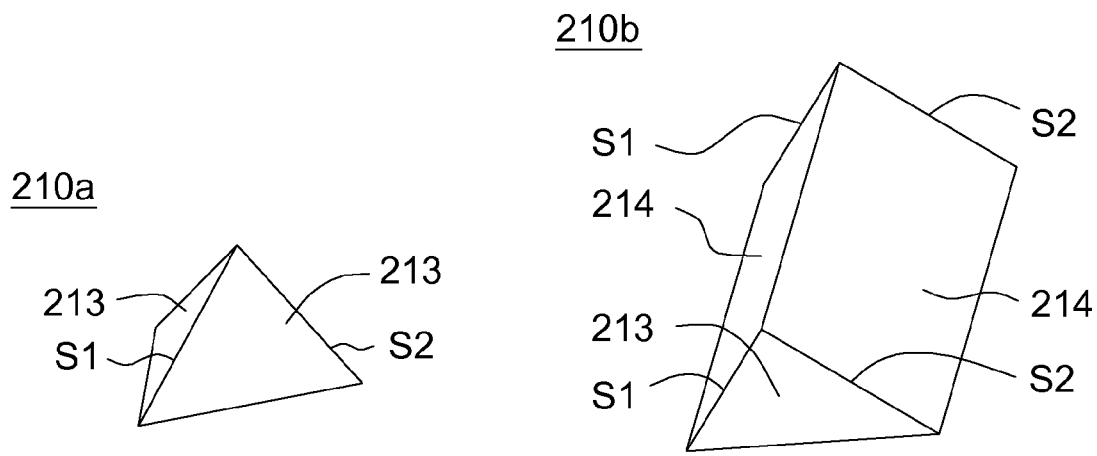
FIGS. 4A~4D respectively show 3D diagrams of a patterned structure according to an embodiment of the invention.

Referring to FIGS. 4A and 4B, asymmetrical geometric shapes such as triangular pyramid 210a or triangular prism 210b are shown. As indicated in FIG. 4A, the triangular pyramid 210a is composed of three scalene triangles 213 intersecting with each other at the vertex, wherein each scalene triangle 213, such as the scalene triangle 113 of the first embodiment (referring to FIG. 1), has two unequal lateral sides S1 and S2. As indicated in FIG. 4B, the triangular prism 210b is composed of two scalene triangles 213 and two scalene quadrilaterals 214, wherein each scalene triangle 213, such as the scalene triangle 113 of the first embodiment (referring to FIG. 1), has two unequal lateral sides S1 and S2, and each scalene quadrilateral 214 is connected between two opposite scalene triangles 213.

Figure 4C:
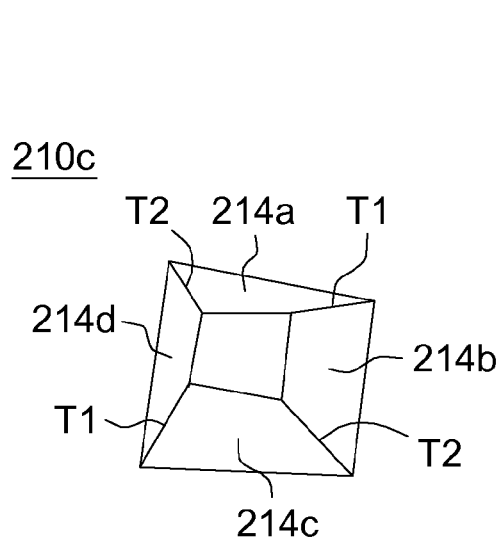
Figure 4D:
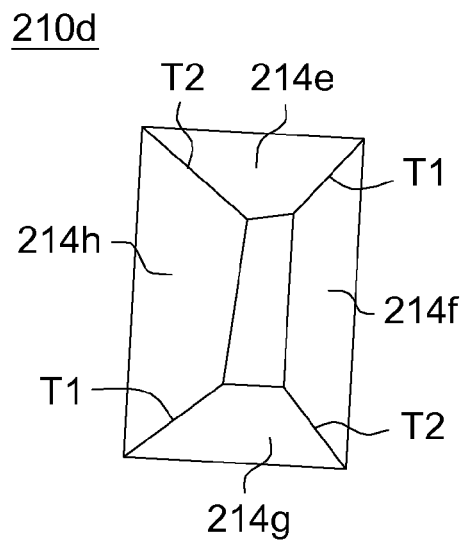

Referring to FIGS. 4C and 4D, examples of asymmetrical geometric shape include square pyramid 210c and quadrangular prism 210d. In FIG. 4C, a flat square pyramid (or a steeple square pyramid) which has four scalene quadrilaterals 214a~214d (or scalene triangles) is taken for example. As indicated in FIG. 4D, the quadrangular prism 210d is composed of four scalene quadrilaterals 214e~214h, wherein each of the scalene quadrilaterals 214a~214h, such as the scalene trapezoid 114 (referring to FIG. 2) of the first embodiment or a quadrilateral, has two unequal lateral sides T1 and T2, so that the four scalene quadrilaterals 214a~214h form an asymmetrical square pyramid 210c or a quadrangular prism 210d.

Third Embodiment

Figure 5:
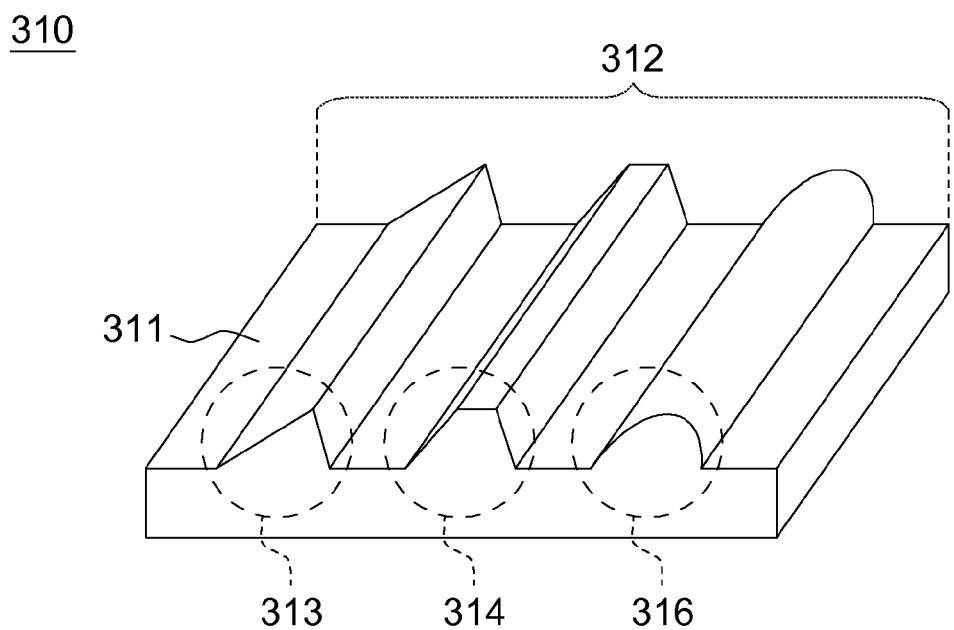
FIG. 5 shows a schematic diagram of a patterned substrate according to an embodiment of the invention.

Referring to FIG. 5, a schematic diagram of a patterned substrate according to an embodiment of the invention is shown. The patterned substrate 310 can be realized by a substrate made from sapphire substrate, silicon carbide substrate or silicon substrate. Despite only the patterned substrate 310 is illustrated in the present embodiment, the scope of protection of the invention is not limited thereto. Like the first embodiment, in the present embodiment of the invention, the first semiconductor layer 124 can be disposed on the surface 311 of the patterned substrate 310. Then, the active layer 126 is disposed on the first semiconductor layer 124, and the second semiconductor is disposed on the active layer 126 to form a semiconductor light emitting structure.

The present embodiment is different from the above embodiments in that the patterned structure 312 is distributed on the surface 311 of the patterned substrate in the shape of strips rather than islands. The patterned structure 312 has asymmetrical geometric strip shape such as scalene triangle 313, scalene trapezoid 314, scalene and non-parallel polygon, arc 316 with variant curvature or a combination thereof. The process and details of manufacturing the patterned structure 312 are disclosed in the first embodiment. According to the present embodiment, the patterned structure 312 with asymmetric geometric shape can be obtained by changing the parameters of the anisotropic etching process or the reactive etching process through the adjustment in the conditions of the manufacturing process, and the patterned structure 312 can further be distributed on the surface 311 of the patterned substrate in strip state.

The semiconductor light emitting structure disclosed in the above embodiments of the invention, the patterned structure protruded form and/or indented into the surface of the substrate makes the surface of the substrate has particular geometric shaped protrusion portion and/or indentation portion. Since the patterned structure has asymmetric geometric shape and makes the light emitted towards the substrate from the LED be reflected and scattered through the patterned structure, the light is radiated outwards and will not easily enter the substrate. Thus, the light extraction efficiency is increased.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor light emitting structure, comprising:
   a substrate;
   a patterned structure protruded from or indented into a surface of the substrate, so that the surface becomes a roughed surface, wherein the patterned structure has an asymmetrical geometric shape;
   a first semiconductor layer disposed on the roughed surface;
   an active layer disposed on the first semiconductor layer; and
   a second semiconductor layer disposed on the active layer;
   wherein the asymmetrical geometric shape comprises scalene triangle, scalene trapezoid, scalene and non-parallel polygon and a combination thereof, the asymmetrical geometric shape has a first hypotenuse and a second hypotenuse opposite to each other, a first angle is contained between the first hypotenuse and the surface, a second angle is contained between the second hypotenuse and the surface, and the first angle is not equal to the second angle.

2. The semiconductor light emitting structure according to 1, wherein the patterned structure is distributed on the surface of the substrate in the shape of strips or islands.

3. The semiconductor light emitting structure according to 1, wherein the asymmetrical geometric shape comprises triangular prism or triangular pyramid having a plurality of scalene triangles.

4. The semiconductor light emitting structure according to 1, wherein the asymmetrical geometric shape comprises quadrangular prism or square pyramid having a plurality of scalene quadrilaterals.

5. The semiconductor light emitting structure according to 1, wherein the asymmetrical geometric shape comprises arc with variant curvature.

6. The semiconductor light emitting structure according to 1, wherein the first angle ranges between 30~90 degrees, and the second angle ranges between 30~90 degrees.

7. The semiconductor light emitting structure according to 1, wherein the substrate is sapphire substrate, silicon carbide substrate or silicon substrate.

8. The semiconductor light emitting structure according to 1, further comprising a non-doped semiconductor layer disposed between the first semiconductor layer and the patterned structure.

9. The semiconductor light emitting structure according to 1, wherein a dislocation in the first semiconductor layer is extended in a horizontal direction and forms a bending from the patterned structure.

10. A semiconductor light emitting structure, comprising:
    a substrate;
    a patterned structure having a protrusion portion protruded from a surface of the substrate, so that the surface becomes a roughed surface, wherein a cross-section of the patterned structure vertical to the surface of the substrate has an asymmetrical geometric shape, the asymmetrical geometric shape has a first hypotenuse and a second hypotenuse opposite to each other, a first angle is contained between the first hypotenuse and the surface, a second angle is contained between the second hypotenuse and the surface, the first hypotenuse has a length not equal to the length of the second hypotenuse and the first angle is not equal to the second angle, wherein both the first angle and the second angle range between 30~90 degrees;

a first semiconductor layer disposed on the roughed surface;

an active layer disposed on the first semiconductor layer; and a second semiconductor layer disposed on the active layer.

11. The semiconductor light emitting structure according to 10, wherein the patterned structure is distributed on the surface of the substrate in the shape of strips or islands.

12. The semiconductor light emitting structure according to 10, wherein the cross-section of the asymmetrical geometric shape comprises scalene triangle, scalene trapezoid, scalene and non-parallel polygon and a combination thereof.

13. The semiconductor light emitting structure according to 10, wherein the asymmetrical geometric shape comprises triangular prism or triangular pyramid having a plurality of scalene triangles.

14. The semiconductor light emitting structure according to 10, wherein the asymmetrical geometric shape comprises quadrangular prism or square pyramid having a plurality of scalene quadrilaterals.

15. The semiconductor light emitting structure according to 10, wherein the asymmetrical geometric shape comprises arc with variant curvature.

16. The semiconductor light emitting structure according to 10, wherein the substrate is sapphire substrate, silicon carbide substrate or silicon substrate.

17. The semiconductor light emitting structure according to 10, further comprising a non-doped semiconductor layer disposed between the first semiconductor layer and the patterned structure.

18. The semiconductor light emitting structure according to 10, wherein a dislocation in the first semiconductor layer is extended in a horizontal direction and forms a bending from the patterned structure.

* * * * *